US008634260B2

(12) United States Patent
Matsubayashi et al.

(10) Patent No.: US 8,634,260 B2
(45) Date of Patent: Jan. 21, 2014

(54) SEMICONDUCTOR DEVICE AND CONTROL METHOD THEREFOR

(76) Inventors: Koji Matsubayashi, Tokyo (JP);
Tetsuya Arai, Tokyo (JP)

(*) Notice: Subject to any disclaimer, the term of this patent is extended or adjusted under 35 U.S.C. 154(b) by 107 days.

(21) Appl. No.: 13/114,710

(22) Filed: May 24, 2011

(65) Prior Publication Data

US 2011/0292710 A1 Dec. 1, 2011

(30) Foreign Application Priority Data

May 28, 2010 (JP) ................................ 2010-122345

(51) Int. Cl.
*G11C 7/00* (2006.01)
(52) U.S. Cl.
USPC .......................................................... 365/200
(58) Field of Classification Search
USPC .................................................. 365/94, 200
See application file for complete search history.

(56) References Cited

U.S. PATENT DOCUMENTS

2003/0065931 A1* 4/2003 Nakai et al. ................... 713/193
2006/0262625 A1 11/2006 Dono et al.

FOREIGN PATENT DOCUMENTS

| JP | 6-203594 A | 7/1994 |
| JP | 2005-116106 A | 4/2005 |
| JP | 2006-323909 A | 11/2006 |

* cited by examiner

*Primary Examiner* — Anthan Tran
(74) *Attorney, Agent, or Firm* — Sughrue Mion, PLLC

(57) ABSTRACT

A semiconductor device includes a first and a second ROMs; and a first control circuit having an input node and sets a first and a second addresses that are different each other to be respectively recorded in the first and second ROMs from a plurality of input addresses supplied sequentially into the input node, on the basis of a setting signal, the plurality of input addresses including the first and second addresses, wherein the first control circuit being configured to set an input address as the first address based on the setting signal, and the first control circuit further being configured to set an input address as the second address on the basis of the setting signal when the first and second addresses are different each other in a predetermined portion of bits after the first address is set to the first ROM.

9 Claims, 16 Drawing Sheets

| ENOR TRUTH TABLE | | EOR | ENOR |
|---|---|---|---|
| A | B | Q | Q |
| 0 | 0 | 0 | 1 |
| 0 | 1 | 1 | 0 |
| 1 | 0 | 1 | 0 |
| 1 | 1 | 0 | 1 |

| REFRESH ADDRESS | | (1) | (2) | (3) | (4) |
|---|---|---|---|---|---|
| UPPER | A<12> | 0 | 0 | 1 | 1 |
| | A<11> | 0 | 1 | 0 | 1 |
| LOWER | A<10:0> | A | A | A | A |

SEMICONDUCTOR DEVICE AND CONTROL METHOD THEREFOR

This application is based upon and claims the benefit of priority from Japanese patent application No. 2010-122345, filed on May 28, 2010, the disclosure of which is incorporated herein in its entirety by reference.

FIELD OF THE INVENTION

This invention relates to a semiconductor device and a control method therefor, and in particular to a semiconductor device requiring a refresh operation and a control method for such a semiconductor device.

BACKGROUND OF THE INVENTION

A DRAM (Dynamic Random Access Memory), which is a kind of semiconductor devices, requires a refresh operation in order to continue storing information. A cycle of refresh operation (refresh cycle) is set to be shorter than retention time of memory cells. However, a multiplicity of memory cells does not necessarily have the same retention time but the retention time may vary among the memory cells. This means that every DRAM includes some memory cells which have retention time that is shorter than the refresh cycle (defective cells). If all of these defective cells should be replaced with redundant memory cells, a large number of redundant memory cell is required. In order to overcome this problem, the defective cells are relieved by setting the number of refresh operations performed for the defective cells per unit time to be greater than the number the refresh operations performed for normal memory cells per unit time. This kind of technology is disclosed, for example, in US Patent Application Serial No. 20060262625 or Japanese Laid-Open Patent Publication No. 2006-323909 (Patent Document 1). In the present specification of the invention, the term "a defective cell" shall be defined as "a cell lacking capability in terms of retention time", and the term "relief of a defective cell" shall be defined as "relief of a defective cell by increasing the number of refresh operations".

SUMMARY

In related arts, the relief of a defective cell is carried out, for example, by a method as described below.

It is assumed that all the memory cells are refreshed in sequence from the address "0001" to "0002" to "0003" and onwards. It is assumed here that the address of a defective cell is "1002". In this case, attention is focused on the lower address "02" of the defective cell. When a memory cell of the address "0002" is refreshed, the memory cell of the address "1002" is also refreshed. This means that when memory cells of addresses "**02" (excluding "1002") are refreshed, the memory cell of the address "1002" is (interrupt) refreshed. In this manner, the number of refresh operations performed on a defective cell per unit time can be made greater than the number of refresh operations performed on normal cells per unit time.

According to this method, however, when a plurality of defective cells is to be relieved, different control is required for those having the same lower address from the control for those having different lower addresses. For example, it is assumed here that the defective cells are of the addresses "1002" and "1102". In this case, after the memory cell of the address "0002" is refreshed, the memory cell of the address "1002" and the memory cell of the address "1102" must be refreshed. Thus, the refresh operation for the memory cell of "0003" is deferred twice. This means that the refresh operation for the memory cell of "0003" is deferred twice on the basis of the time when the memory cell of "0003" is supposed to be refreshed if no defective cells exist. In contrast, if the defective cells are of the addresses "1002" and "1103", the refresh operation for the memory cell of "0003" is deferred only once.

In the method of relieving a defective cell according to the related art, as described above, the number of interrupt-refresh operations and the timing for performing the interrupt-refresh operations must be changed according to whether or not there is a plurality of defective cells having the same lower address. Thus, the method of relieving defective cells according to the related art has a problem that the method requires a refresh control circuit having a complicated configuration for performing complicated control.

A semiconductor device according to an embodiment of this invention includes a first and a second ROMs, and a first control circuit. The first control circuit has an input node and sets a first and a second addresses that are different from each other to be respectively recorded in the first and second ROMs from a plurality of input addresses supplied sequentially into the input node, on the basis of a setting signal. The plurality of input addresses include the first and second addresses. The first control circuit is configured to set an input address as the first address based on the setting signal. The first control circuit is further configured to set an input address as the second address on the basis of the setting signal when the first and second addresses are different from each other in a predetermined portion of bits after the first address is set to the first ROM.

BRIEF DESCRIPTION OF THE DRAWINGS

The above features and advantages of the present invention will be more apparent from the following description of certain preferred embodiments taken in conjunction with the accompanying drawings, in which:

FIG. 9 is a diagram illustrating an example of a plurality of addresses having different upper addresses and the same lower address;

FIG. 10 is a diagram for explaining a method of relieving a defective cell by refresh;

DETAILED DESCRIPTION OF PREFERRED EMBODIMENTS

The invention will be now described herein with reference to illustrative embodiments. Those skilled in the art will recognize that many alternative embodiments can be accomplished using the teachings of the present invention and that the invention is not limited to the embodiments illustrated for explanatory purposes.

A representative example of a technical concept for solving the problem of this invention will be described below. However, it should be understood that what is claimed in this application is not limited to this technical concept but it is defined by the appended claims.

Figure 1:
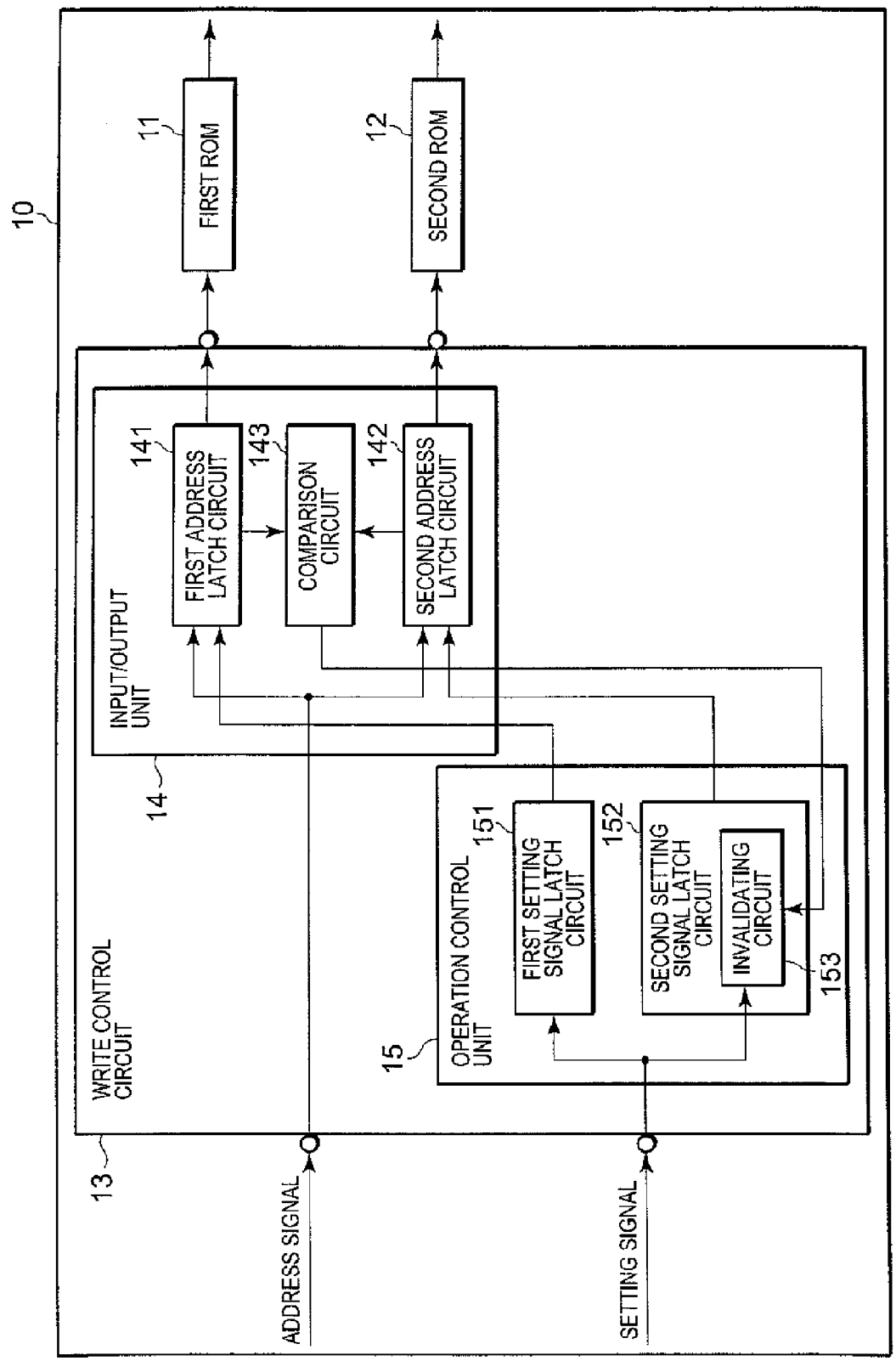
FIG. 1 is a block diagram illustrating a typical example of a semiconductor device embodying a technical concept of this invention.

A semiconductor device 10 shown in FIG. 1 has a first and a second ROMs (Read Only Memory) 11, 12, and a write control circuit 13 for setting first and second addresses to be respectively recorded in the first and second ROMs 11, 12 on the basis of an input address signal and a setting signal which are externally input to corresponding input nodes.

The write control circuit 13 firstly sets an address indicated by the input address signal as the first address based on the setting signal. The write control circuit 13 then sets another address indicated by the input address signal as the second address based on the setting signal. The write control circuit 13 sets the second address such that the first address and the second address differ from each other in a predetermined portion of the bits.

More particularly, the write control circuit 13 has an input/output unit 14 and an operation control unit 15 for controlling operation of the input/output unit 14.

The input/output unit 14 has a first and a second address latch circuits 141, 142, and a comparison circuit 143 for comparing intermediate outputs thereof. The first and second address latch circuits 141, 142 are respectively supplied with signals obtained by bifurcating the input address signal. The first and second address latch circuits 141, 142 respectively latch the input address signal in response to a first and a second actuating signals from the operation control unit 15. The comparison circuit 143 compares the intermediate outputs from the first and second address latch circuits 141, 142 with each other. The term "intermediate outputs of the first and second address latch circuits 141, 142" as used herein means a portion of the input address signal before the latch, and a portion of the latched address signal after the latch. The term "a portion of the input address signal" means a portion of the input address signal corresponding to the lower address, for example, the portion representing the remaining bits except the upper two bits.

The operation control unit 15 has a first and a second setting signal latch circuits 151, 152. The second setting signal latch circuit 152 includes a setting signal invalidating circuit 153. The first and second setting signal latch circuits 151, 152 are supplied respectively with signals obtained by bifurcating the setting signal. The first setting signal latch circuit 151 performs a latch operation in response to the first setting instruction of the input setting signal (low-level "L", for example) and outputs a first actuating signal to the first address latch circuit 141. The setting signal invalidating circuit 153 of the second setting signal latch circuit 152 invalidates the setting signal input when the output from the comparison circuit 143 indicates that the comparison result is match. If the output from the comparison circuit 143 indicates that the comparison result is mismatch, the setting signal invalidating circuit 153 performs a latch operation in response to the input setting signal, and outputs a second actuating signal to the second address latch circuit 142.

When neither of the first and second address latch circuits 141, 142 has latched an address signal corresponding to a relief address, the intermediate outputs of the first and second address latch circuits 141, 142 are both a portion of the bifurcated input address signals. In this case, the comparison circuit 143 outputs a signal indicating "match" to the setting signal invalidating circuit 153. Once the first setting signal is input to the operation control unit 15 in this state, the first setting signal latch circuit 151 outputs a first actuating signal in response to this setting signal. On the other hand, in the second setting signal latch circuit 152, the setting signal is invalidated by the setting signal invalidating circuit 153. Therefore, no second actuating signal is output by the second setting signal latch circuit 152. As a result, the first address latch circuit 141 latches the address signal which is being input, as the first address signal, whereby the first address is set.

After that, the comparison circuit 143 compares the portion of the address signal latched by the first address latch circuit 141 with the portion of the input address signal. The output of the comparison circuit 143 indicates whether the two match or not in accordance with a change in the input address signal.

When the output of the comparison circuit 143 indicates "match", the setting signal input to the second setting signal latch circuit 152 is invalidated by the setting signal invalidating circuit 153. In contrast, when the output of the comparison circuit 143 indicates "mismatch", the setting signal input to the second setting signal latch circuit 152 is not invalidated by the setting signal invalidating circuit 153. Therefore, the second setting signal latch circuit 152 outputs a second actuating signal to the second address latch circuit 142 in response to the input setting signal when the output of the comparison circuit 143 indicates "mismatch". The second address latch circuit 142 then latches the input address signal as the second address signal in response to the second actuating signal.

As a result, the second address indicated by the second address signal latched by the second address latch circuit 142 has a lower address that is different from that of the first address indicated by the first address signal latched by the first address latch circuit 141.

The first and second addresses are then written in the first and second ROMs, respectively.

Since the first and second addresses have different lower addresses, the refresh control using theses addresses can be simplified. This makes it possible to simplify the configuration of the control circuit, and thus to achieve size reduction of the semiconductor device.

It should be noted that, according to this invention, when there exists a plurality of defective cells having the same lower address, only one of these cells can be relieved. However, the probability that a plurality of defective cells have the same lower address (depending on the number of bits) is realistically very low, it does actually not pose any serious problem. It is also possible to configure such that, when a plurality of defective cells have the same lower address, those defective cells are relieved physically (by replacing them with redundant memory cells).

Referring to the accompanying drawings, exemplary preferred embodiments of this invention will be described in more detail.

Figure 2:
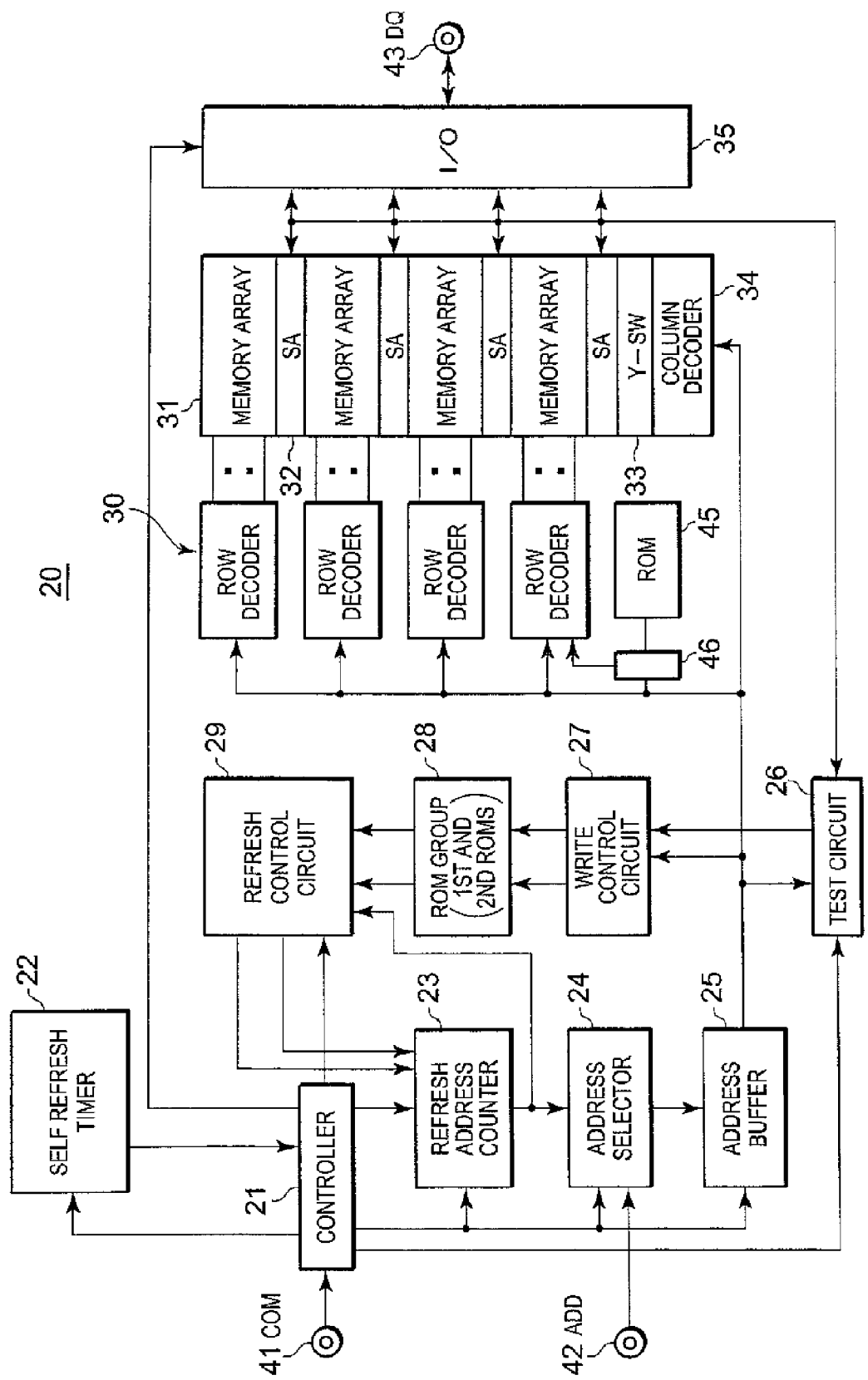
FIG. 2 is a block diagram illustrating a semiconductor device according to a first embodiment of this invention.

FIG. 2 is a block diagram illustrating a schematic configuration of a semiconductor device 20 according to a first embodiment of this invention.

The semiconductor device 20 shown here is a memory device (DRAM or Dynamic Random Access Memory) requiring a refresh operation. The semiconductor device 20 has a controller 21, a self-refresh timer 22, a refresh address counter 23, an address selector 24, an address buffer 25, a test circuit 26, a write control circuit 27, a ROM group 28, a refresh control circuit 29, row decoders 30, memory arrays 31, a sense amplifier (SA) group 32, a Y-switch (Y-SW) 33, a column decoder 34, and an I/O (input/output) circuit 35. The write control circuit 27 corresponds to the write control circuit 13 of FIG. 1, and the ROM group 28 corresponds to the first and second ROMs 11, 12 of FIG. 1.

The controller 21 decodes a command COM input from a command input terminal 41, sends a control signal to each block according to the command, and thereby controls various operations of the semiconductor device 20.

The self-refresh timer 22 controls the time interval to perform a refresh operation.

The refresh address counter 23 counts up the number of refresh operations under the control of the refresh control circuit 29. Once the counted number of refresh operations reaches a preset number, the refresh address counter 23 is reset and restarts the count up from the beginning. The number counted by the refresh address counter 23 is utilized as an address to be refreshed.

The address selector 24 selects a row address from the refresh address counter 23 or an address from an address input terminal 42.

The address buffer 25 outputs the address selected by the address selector 24 to various parts at a predetermined timing. The signal representing this address corresponds to the address signal of FIG. 1.

The test circuit 26 may be any that is capable of conducting tests relating to retention time of a plurality of memory cells included in a memory array 31. The test circuit 26 conducts a test on the memory cell corresponding to the address signal from the address buffer 25, and outputs to the write control circuit 27 a result signal indicating whether the relevant memory cell has passed or failed in the test. For example, the memory cell is determined to be "pass" when its retention time is equal to or longer than a reference time period, while it is determined to be "fail" when its retention time is shorter than the reference time period. The result signal corresponds to the setting signal of FIG. 1.

The write control circuit 27 retrieves an address from the address buffer 25 based on the result signal from the test circuit 26. In other words, the address signal to be output to the ROM group 28 is set in the write control circuit 27 based on the result signal from the test circuit 26. The lower addresses of the plurality of addresses set in the write control circuit 27 are different from each other in a plurality of bits.

The ROM group 28 has a plurality of ROMs (two ROMs in this example). Each of the ROMs may be an antifuse or a fuse employing another principle. The ROM group 28 is capable of storing addresses set in the write control circuit 27. The addresses stored in the ROM group 28 are row addresses of the memory cells (or the word lines connected to the memory cells) which have short retention time and are relieved by performing refresh operations at a cycle shorter than a normal refresh cycle.

The refresh control circuit 29 receives input of a counter address from the refresh address counter 23 and an address from the ROM group 28, and outputs a control signal to the refresh address counter 23.

Each of the row decoders 30 activates a word line of the corresponding memory array 31 according to the address from the address buffer 25.

Each of the memory arrays 31 has a multiplicity of memory cells arranged in matrix, and a plurality of word lines and a plurality of bit lines connected to these memory cells. The memory cells need be refreshed within a predetermined time in order to keep storing information.

The plurality of bit lines of each memory array 31 are connected to any of sense amplifiers included in the sense amplifier group 32.

The column decoder 34 decodes a column address from the address buffer 25 and controls the Y-switch 33. As a result, a sense amplifier included in the sense amplifier group 32 is selectively connected to the I/O circuit 35. Thereby, data is exchanged between the memory array 31 and the I/O circuit 35.

The I/O circuit 35 exchanges data with the outside through DQ pins 43 (one of them is shown in FIG. 2).

When the memory array 31 includes a redundant cell array so that a defective cell is physically relieved with the use of this redundant cell array, there are provided with a physical relief ROM 45 for storing the address of a defective cell, and a physical relief comparison circuit 46 for comparing an address from the address buffer 25 and an address from the physical relief ROM 45. The column addresses also can be handled by providing a physical relief ROM and a physical relief comparison circuit. Examples of such a technology are disclosed, for example, in Japanese Laid-Open Patent Publication Nos. H6-203594 and 2005-116106.

There are shown four memory arrays 31 in FIG. 2. One sense amplifier (one array of sense amplifiers) is interposed between each two memory arrays 31 located adjacent to each other. The two memory arrays 31 define regions to be accessed exclusively from each other. The one sense amplifier is an amplifier to be used when the two memory arrays 31 are accessed respectively. When it is assumed that each of these four memory arrays 31 includes 2048 word lines, the total number of the word lines is 8192. When these word lines are sequentially assigned with addresses of serial numbers, the four memory arrays 31 are assigned with addresses of "0000 to 2047", "2048 to 4095", "4096 to 6143", and "6144 to 8191", respectively. When theses addresses are expressed as binary numbers, each address is represented by 13 bits. And the upper two bits of each address are for selecting the four memory arrays 31.

The remaining 11 bits are for selecting word lines in the memory arrays 31. In the following description, the upper two bits for selecting the memory arrays 31 (memory blocks) shall be called the upper address, while the lower 11 bits for selecting the word lines in the memory arrays 31 shall be called the lower address. However, the numbers of bits of the upper address and lower address (so called herein) are not limited to those described herein, but are determined according to the number and configuration of the memory arrays 31 and a refreshing method to be described later.

When a normal refresh operation is performed in the semiconductor device 20, the word lines are activated sequentially in response to a refresh command REF input sequentially. The refresh cycle is 64 ms, for example.

When a defective cell having short retention time is refreshed at a refresh cycle shorter than a normal refresh cycle, a word line connected to the defective cell is activated not only when the word line connected to the defective cell is designated but also when word lines of other memory arrays 31 having the same lower address as the lower address of the defective cell are designated. The activation of the word line connected to the defective cell can be performed either simultaneously with or at a different timing from the activation of the word lines of the other memory arrays 31 having the same lower address as that of the defective cell. If the activations are performed simultaneously, the relevant word lines must belong to different memory arrays 31 and must be connected to different sense amplifiers.

For example, if a defective cell is connected to the word line "0003", the activation of the word line "0003" is performed also when the word line "2051 (=2048+0003)", the word line "4099 (=2048×2+0003)", and the word line "6147 (=2048×3+0003)" are activated. Thus, the word line "0003" is refreshed every about 64/4=16 ms. In this manner, the defective cells having short retention time can be refreshed at a shorter refresh cycle than a normal refresh cycle. In other words, the number of refresh operations per unit time performed for defective cells having short retention time can be increased in comparison with the number of refresh operations per unit time performed for normal memory cells.

The semiconductor device 20 will be described in more detail.

Figure 3:
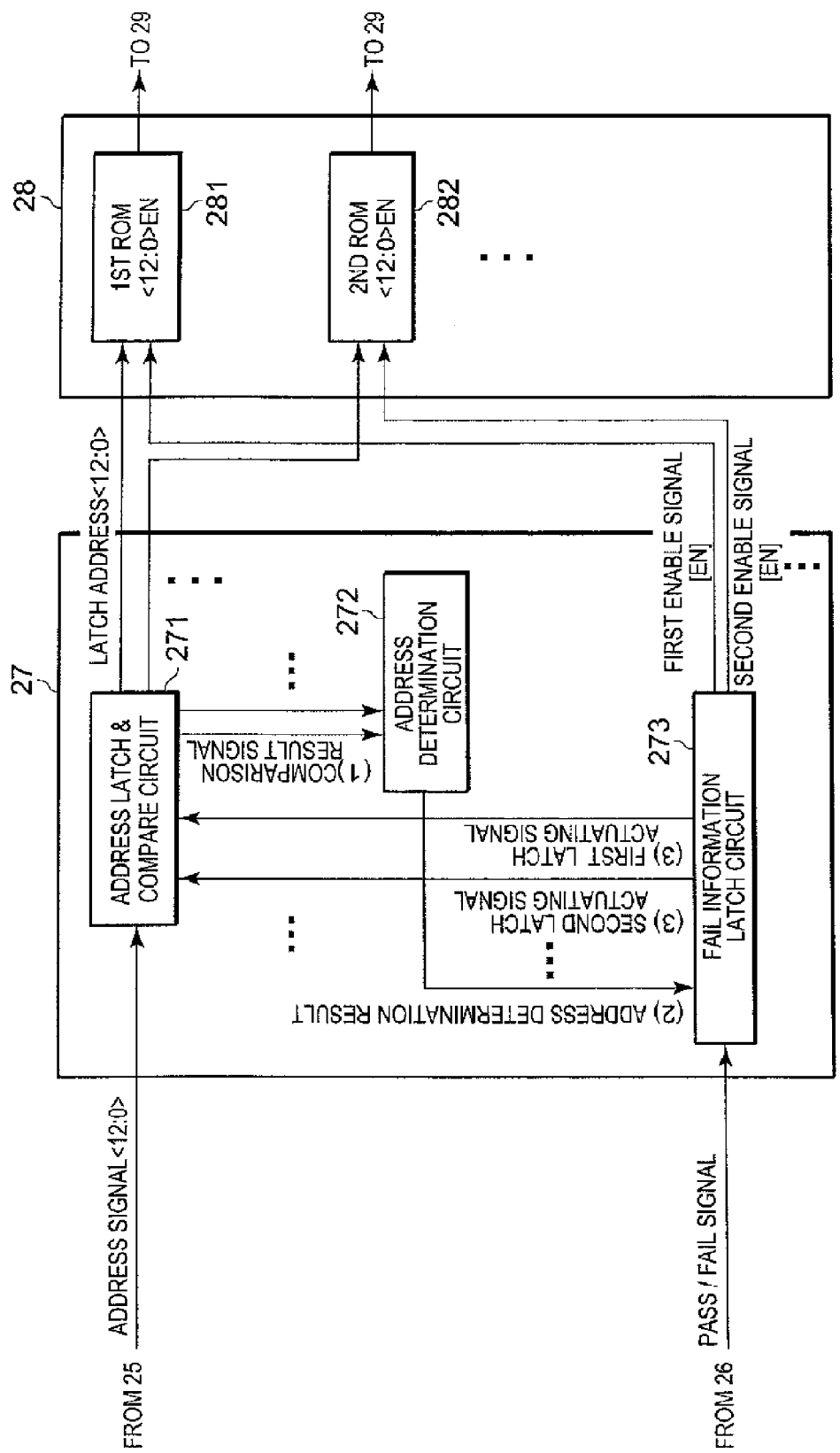
FIG. 3 is a block diagram illustrating internal configurations of a write control circuit and a ROM group provided in the semiconductor device of FIG. 2.

As shown in FIG. 3, the ROM group 28 has at least two ROMs that is, a first ROM 281 and a second ROM 282.

The write control circuit 27 has an address latch and compare circuit 271, an address determination circuit 272, and a fail information latch circuit 273.

The address latch and compare circuit 271 has address latch circuits respectively associated with the ROMs included in the ROM group 28. In the description below, an address latch circuit associated with the n-th (n is a natural number) ROM shall be called the n-th address latch circuit. Each of the address latch circuits has a number of latch units equal to the number of the bits of the address signal. Since the address signal assumed here is composed of 13 bits <12:0>, each of the address latch circuits has 13 latch units (and their peripheral circuits).

The address latch and compare circuit 271 further has a number of address bit comparison circuits equal to the number obtained by subtracting one from the number of ROMs included in the ROM group 28. The address bit comparison circuits are respectively associated with the second ROM 282 and subsequent ROMs. The address bit comparison circuit associated with the n-th (n≥2) ROM compares an intermediate output of the (n−1)-th address latch circuit with an intermediate output of the n-th address latch circuit. The intermediate output represents the lower address of an address indicated by an input address signal before a latch operation is performed by the address latch circuit, and represents the lower address of the latch address after the latched operation is performed. The lower address is defined by the lower 11 bits <10:0> of 13 bits forming the address.

Figures 4, 5:
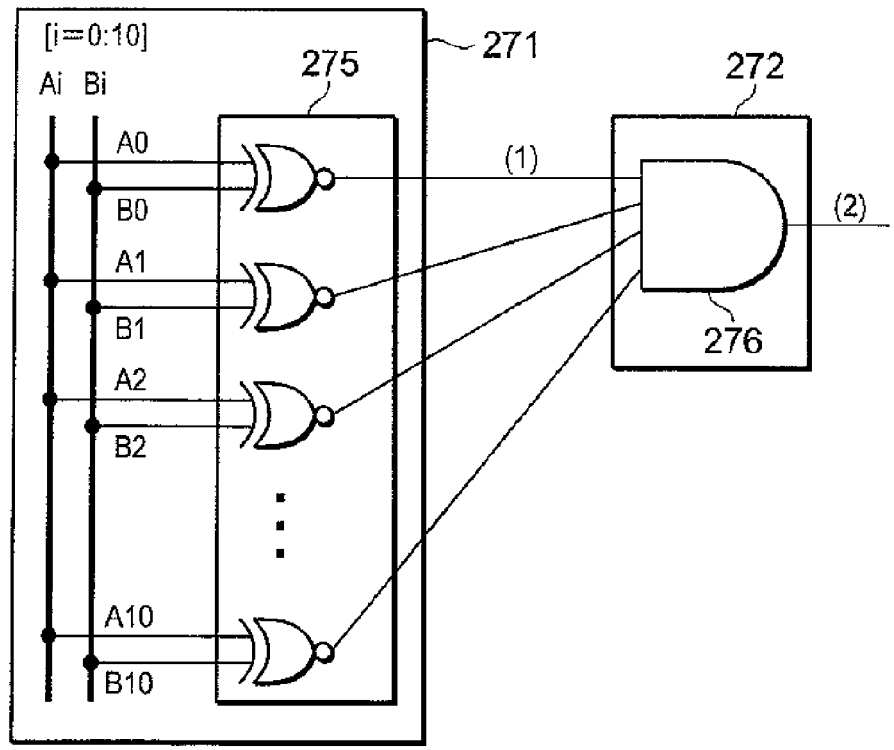
FIG. 4 is a circuit diagram illustrating internal configurations of an address latch and compare circuit and an address determination circuit provided in the write control circuit of FIG. 3.
FIG. 5 is a truth table of exclusive NOR and exclusive.

Each of the address bit comparison circuits compares the intermediate outputs of two address latch circuits bit by bit, and outputs a comparison result signal (1). Each of the address bit comparison circuits may be formed by an exclusive NOR circuit (ENOR) group 275, as shown in FIG. 4. The truth table of the exclusive NOR circuit is as shown in FIG. 5.

Returning to FIG. 3, the comparison result signal (1) is supplied to the address determination circuit 272. The address determination circuit 272 has address determination units associated with the address bit comparison circuits. Each of the address determination units determines, based on the comparison result from the associated address bit comparison circuit, whether or not the addresses indicated by the intermediate outputs of the two address latch circuits match each other, and outputs the comparison result as an address determination result (2). The address determination unit may be configured, for example, using an AND circuit 276 as shown in FIG. 4.

Returning again to FIG. 3, the address determination result (2) is supplied to the fail information latch circuit 273. The fail information latch circuit 273 has processing paths associated with the respective ROMs included in the ROM group 28. Once a first PASS/FAIL signal indicating FAIL is input, the fail information latch circuit 273 performs a latch operation in the first processing path associated with the first ROM 281, and outputs a first latch actuating signal (3) to the address latch and compare circuit 271, while simultaneously outputting a first ENABLE signal <EN> to the first ROM 281. The first latch actuating signal (3) and the first ENABLE signal <EN> are practically the same signals. The first ENABLE signal is used, when the address <12:0> written in the first ROM 281 is composed of all "0", in order to identify that the address to be relieved has been written in the first ROM. This means that the first ENABLE signal is used as information indicating that the record has been done. This information may be written, for example, by providing the first ROM with an antifuse for the first ENABLE signal and breaking the same once the first ENABLE signal is input.

In the n-th processing path associated with the n-th ROM, once a PASS/FAIL signal indicating FAIL is input when the address determination result from the associated address determination unit indicates mismatch, the fail information latch circuit 273 performs a latch operation and outputs an n-th latch actuating signal to the address latch and compare circuit 271, while simultaneously outputting an n-th ENABLE signal to the n-th ROM. The n-th ENABLE signal is the same as the first ENABLE signal. As long as the address determination result indicates match, a PASS/FAIL signal input to the processing path associated with the n-th ROM is invalidated.

Figure 6:
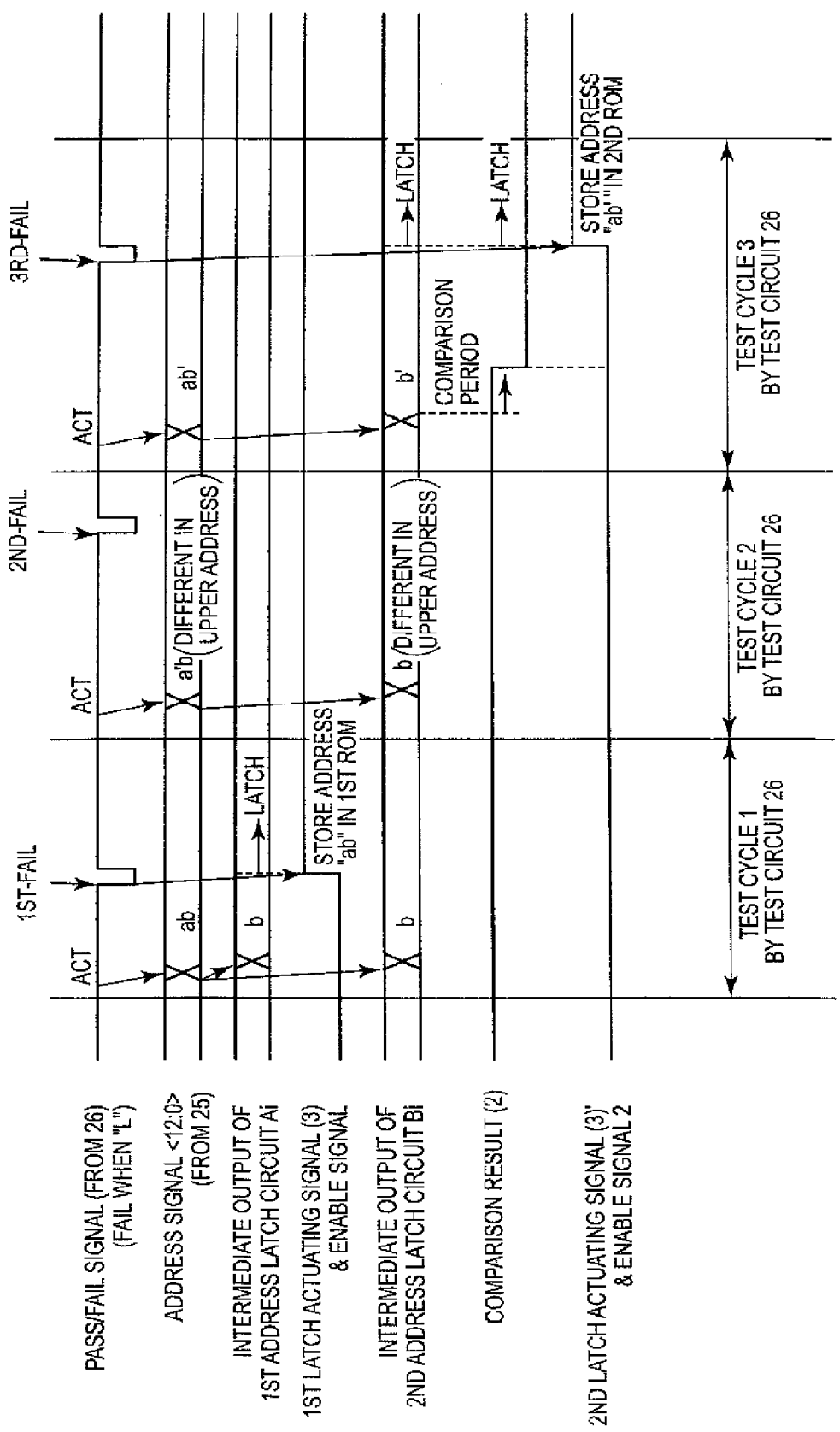
FIG. 6 is a time chart for explaining operation of the write control circuit of FIG. 3.

Next, operation of the write control circuit 27 will be described with reference to FIG. 6 as well. In order to simplify the description, the ROM group 28 is assumed to have two ROMs, that is, a first and a second ROMs 281, 282.

It is assumed that an address signal indicating an address "ab" is input to the write control circuit 27 in response to the first command ACT. It is assumed here that "a" represents the upper address, while "b" represents the lower address. The address signal is supplied to the first and second address latch circuits of the address latch and compare circuit 271. Neither the first nor second address latch circuit has performed a latch operation, they output the lower address "b" of the input address signal as intermediate outputs Ai and Bi. The address bit comparison circuit outputs a high level "H" as a comparison result indicating "match" since the intermediate outputs of the first and second address latch circuits are both "b".

If a PASS/FAIL signal of a low level "L" indicating FAIL (1st-FAIL) is received from the test circuit 26 in this state as a result of a test conducted on the address "ab", the fail information latch circuit 273 accordingly outputs a high level "H" as a first latch actuating signal and a first ENABLE signal. As a result, the first address latch circuit performs a latch operation to latch the address "ab". Thus, the address "ab" is set as an address to be written in the first ROM. After that, the intermediate output from the first address latch circuit is fixed to "b".

Next, it is assumed that an address signal indicating address "a'b" is input to the write control circuit 27 in response to the second command ACT. This address is different from the address previously latched by the first address latch circuit in the upper address, but is the same in the lower address. This means that the intermediate outputs Ai and Bi output by the first and second address latch circuits are both "b". Consequently, the address bit comparison circuit outputs a comparison result of "H" indicating "match".

Even if a PASS/FAIL signal of a low level "L" indicating FAIL (2nd-FAIL) is received from the test circuit 26 in this state as a result of a test conducted on the address "a'b", the fail information latch circuit 273 disregards (invalidates) this signal. This means that the fail information latch circuit 273 does not output a second latch actuating signal (3)' or second ENABLE signal EN.

Next, it is assumed that an address signal indicating address "ab'" is input to the write control circuit 27 in response to the third command ACT. This address is different in the lower address from the address previously latched by the first address latch circuit. Specifically, the intermediate output Ai output by the first address latch circuit indicates "b", while the intermediate output Bi output by the second address latch circuit indicates "b'". Consequently, the address bit comparison circuit outputs "L" indicating "mismatch" as the comparison result.

If a PASS/FAIL signal of a low level "L" indicating FAIL (3rd-FAIL) is received from the test circuit 26 in this state as a result of a test conducted on the address "ab'", the fail information latch circuit 273 outputs a second latch actuating signal (3)' and a second ENABLE signal "H". As a result, the second address latch circuit performs a latch operation to latch the address "ab'". Thus, the address "ab'" is set as the address to be written in the second ROM.

In the semiconductor device 20 according to this embodiment of the invention, as described so far, a plurality of addresses which are different from each other in the lower bits are set as the addresses to be written in a plurality of ROMs included in the ROM group 28.

Figure 7:
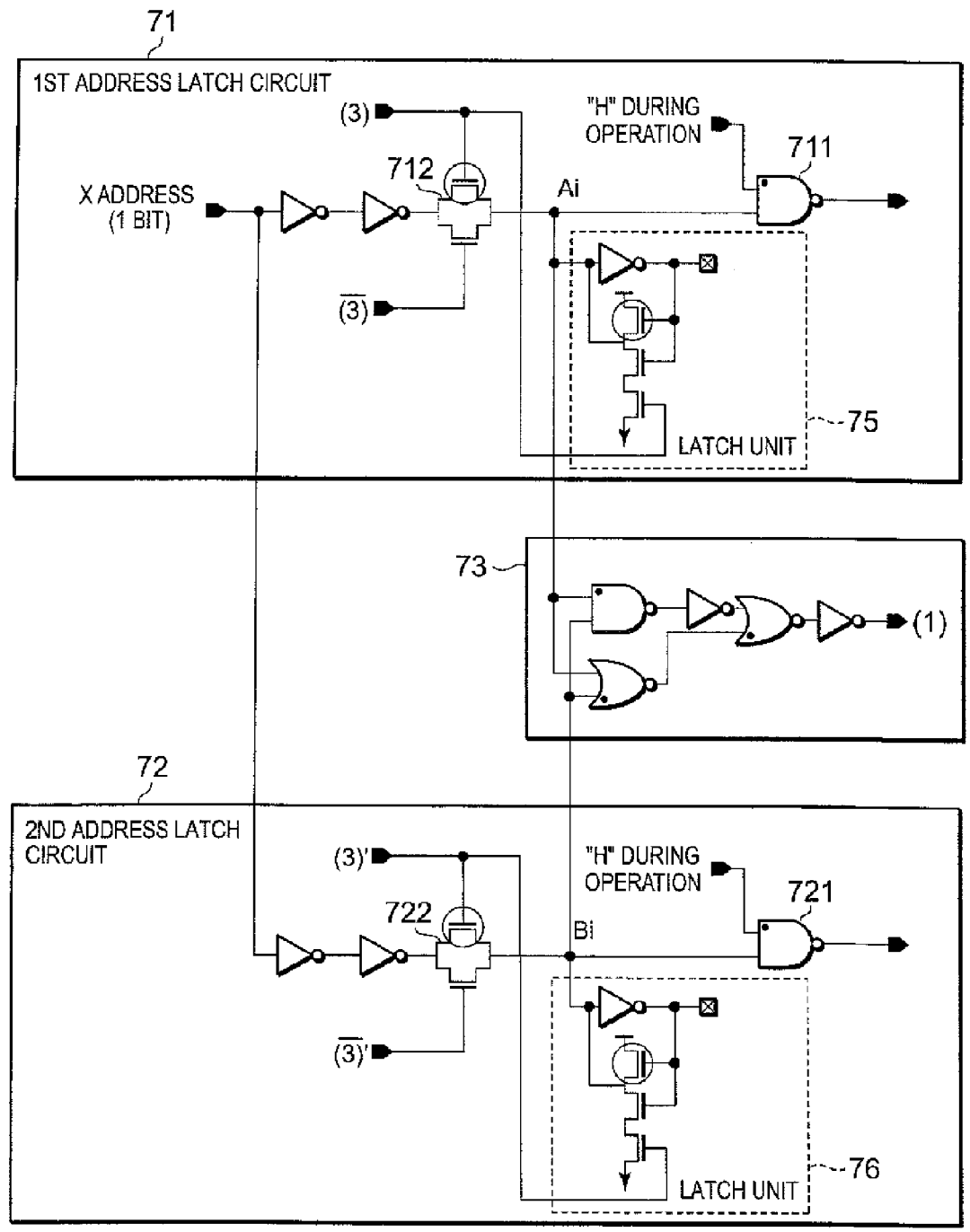
FIG. 7 is a circuit diagram illustrating a partial configuration of the address latch and compare circuit provided in the write control circuit of FIG. 3.
Figure 8:
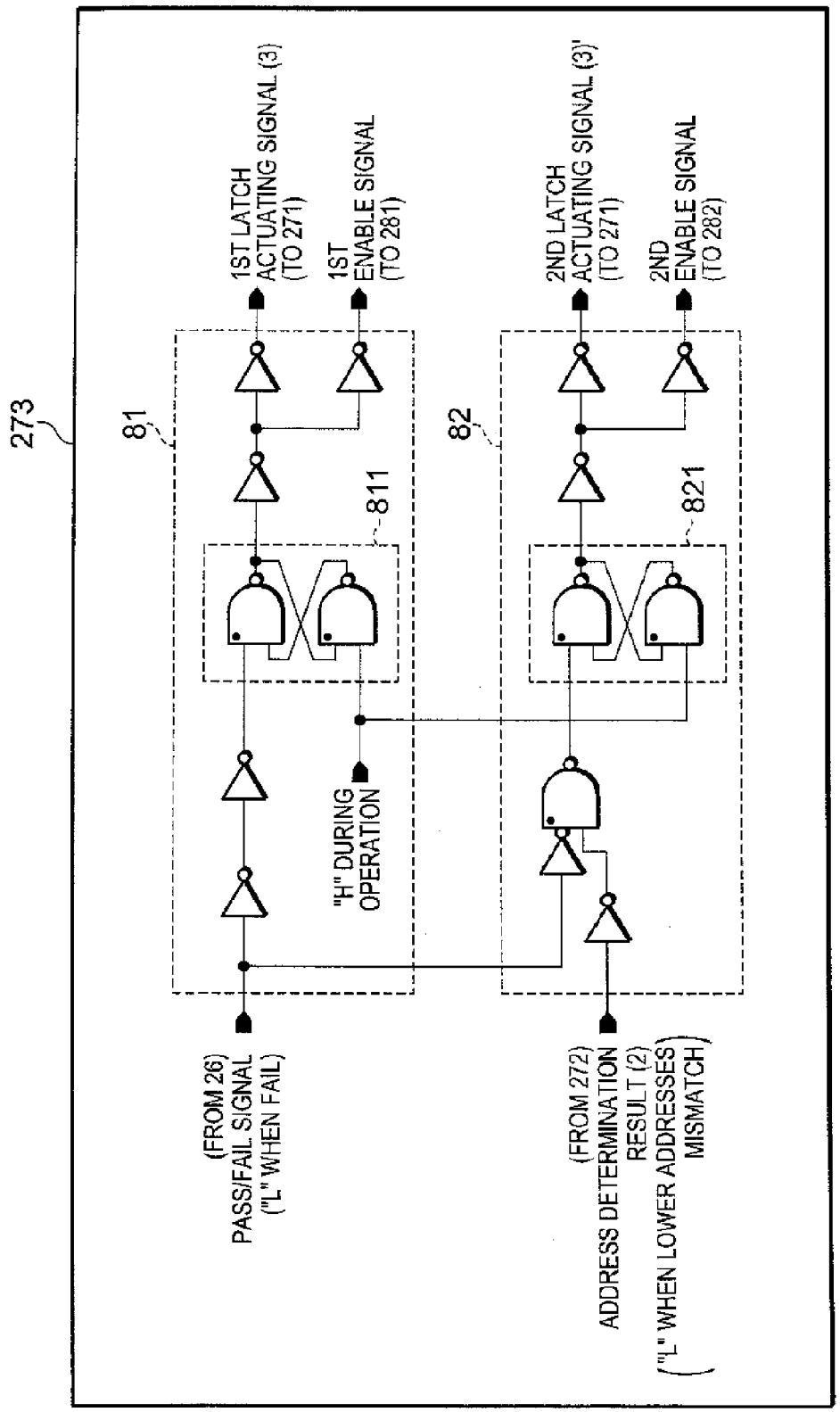
FIG. 8 is a circuit diagram illustrating an internal configuration of a fail information latch circuit provided in the write control circuit of FIG. 3.

In order to implement the operation described above, the address latch and compare circuit 271 is configured, for example, as shown in FIG. 7. The fail information latch circuit 273 is configured, for example, as shown in FIG. 8.

The address latch and compare circuit 271 of FIG. 7 has a first and a second address latch circuits 71,72, and an address bit comparison circuit 73 connected thereto. FIG. 7 illustrates a part of the address latch and compare circuit 271 which is in charge of any one bit of the lower address. The parts which are in charge of the other bits of the lower address are configured in the same manner as that shown in FIG. 7. The configuration of a part in charge of each bit of the upper address is the same as that shown in FIG. 7 but the address bit comparison circuit 73 is omitted therefrom.

The first and second address latch circuits 71, 72 have latch units (inverter latch units) 75, 76 and their peripheral circuits, respectively. The peripheral circuits include NAND circuits 711, 721 and pass gates 712, 722. The address bit comparison circuit 73 has an exclusive NOR circuit (ENOR).

One of the input terminals of the address bit comparison circuit 73 is connected to a node between the pass gate 712 and the latch unit 75 (first node), while the other input terminal is connected to a node between the pass gate 722 and the latch unit 76 (second node).

During operation, one of the input terminals of each of the NAND circuits 711, 721 included in the first and second address latch circuits 71, 72 is supplied with a high level "H". The pass gates 712, 722 are supplied respectively with the first and second latch actuating signals (3), (3)' and their inverted signals. The pass gates 712, 722 are open (electrically conductive) before a latch operation, and are closed once the first and second latch actuating signals (3), (3)' become "H".

The first and second address latch circuits 71, 72 receive input of signals obtained by bifurcating the address signal. The pass gates 712, 722 are open in the state in which none of the first and second address latch circuits 71, 72 have latched, these bifurcated address signals are input to the address bit comparison circuit 73. As a result, the comparison result of the address bit comparison circuit 73 indicates "match". Thus, as described above, the second address latch circuit 72 does not perform an address latch operation until the first address latch circuit 71 performs an address latch operation.

Once the first address latch circuit 71 performs a latch operation, the pass gate 712 is closed (becomes electrically non-conductive), and the address latched by the latch units 75 is output to the address bit comparison circuit 73. On the other hand, the second address latch circuit 72 continues to output the input address to the address bit comparison circuit 73. As a result, the comparison result of the address bit comparison circuit 73 indicates match or mismatch according to the input address signal. Consequently, as described above, the second address latch circuit 72 performs a latch operation when predetermined lower bits of the address latched by the first address latch circuit 71 does not match the predetermined lower bits of the input address. Thus, the first address and the second address set in the write control circuit 27 have different lower bits from each other.

Next, the fail information latch circuit 273 will be described with reference to FIG. 8.

The fail information latch circuit 273 of FIG. 8 has a first processing path 81 corresponding to the first ROM 281 and a second processing path 82 corresponding to the second ROM 282. The processing paths 81, 82 include SR latch circuits 811, 821, respectively. Herein, SR stands for set-reset.

In the first processing path 81, a PASS/FAIL signal from the test circuit 26 is supplied to one of the inputs (set side terminal) of the SR latch circuit 811 via a two-stage inverter circuit. Therefore, the output of the SR latch circuit 811 becomes "H" according to the PASS/FAIL signal "L" indicating FAIL, and the first latch actuating signal (3) and the first ENABLE signal both become "H".

On the other hand, the PASS/FAIL signal from the test circuit 26 is bifurcated and is also supplied to the second processing path 82. NOR of the PASS/FAIL signal input to the second processing path 82 with the address determination result is obtained and supplied to one of the inputs (set side terminal) of the SR latch circuit 821. This means that a PASS/FAIL signal "L" indicating FAIL is supplied to one of the inputs of the SR latch circuit 821 only when the address determination result (2) from the address determination circuit 272 indicates "mismatch". In this case, the second latch actuating signal (3)' and the second ENABLE signal both become "H".

As a result, the first address which is set as an address to be written in the first ROM 281 and the second address which is set as an address to be written in the second ROM 282 are different from each other in their lower addresses of a predetermined number of bits.

The first address and the second address set in the write control circuit 27 are transmitted to the ROM group 28 at a ROM write cycle, and written (stored) in the first ROM 281 and the second ROM 282, respectively. The SR latch circuits 811, 821 are reset in conjunction with initialization (clearing) of information stored in the first ROM 281 and the second ROM 282. Once a one-shot pulse signal (which transits from Low to High, and further to Low) is supplied to the reset side terminals of the SR latch circuits 811, 821, the SR latch circuits 811, 821 are reset. In order to reset (initialize) the first ROM 281 and the second ROM 282 independently from each other, signals must be supplied to the reset side terminals of the SR latch circuits 811, 821 independently from each other.

Next, description will be made of a method for refreshing semiconductor device 20 according to this embodiment and a configuration for implementing the method.

Consideration is given to four addresses (1) to (4) shown in FIG. 9, on the assumption that, as described above, there are 8192 word lines in total in the four memory arrays 31. These addresses have the same lower address A <10:0> consisting of the lower 11 bits, as indicated all by "A", whereas they have different upper addresses A<12> and A<11> consisting of the upper two bits.

In a normal refresh operation, all the word lines are activated sequentially one by one. Therefore, the activation of the word lines associated with these four addresses is performed at fixed time interval as shown in (a) of FIG. 10.

If a word line of the address (1) is connected to a defective cell having short retention time, the defective cell connected to the address (1) can be relieved by activating the word line of the address (1) in the wake of the activation of the word lines of the addresses (2), (3) and (4) which have the same lower address as the address (1), as shown in (b) of FIG. 10. In FIG. 10, [1] indicates irregular activation of the word line of the address (1).

If word lines of the addresses (1) and (2) are connected to defective cells having short retention time, the defective cells can be relieved by activating the word lines, as shown in (c) of FIG. 10. Likewise, if word lines of the addresses (1) to (3) are connected to defective cells having short retention time, the defective cells connected to the word lines of the addresses (1) to (3) can be relieved by activating the word lines as shown in (d) of FIG. 10. If word lines of the addresses (1) to (4) are connected to defective cells having short retention time, the defective cells connected to the word lines of the addresses (1) to (4) can be relieved by activating the word lines as shown in (e) of FIG. 10.

However, refresh control as shown in (c) to (e) of FIG. 10 is so complicated that the control circuit for controlling the refresh must have a complicated configuration. According to this embodiment of the invention, the refresh control as shown in (c) to (e) of FIG. 10 can be avoided by designing such that a plurality of ROMs included in the ROM group 28 store addresses which are different from each other in their lower addresses. Since the probability is very low that memory cells having the same lower address become defective together, the yield will not be substantially deteriorated even if such semiconductor devices are treated as defective. On the other hand, the control circuit can be simplified, which decreases the area occupied by the control circuit. Thus, the size reduction of the semiconductor device can be achieved.

Figure 11:
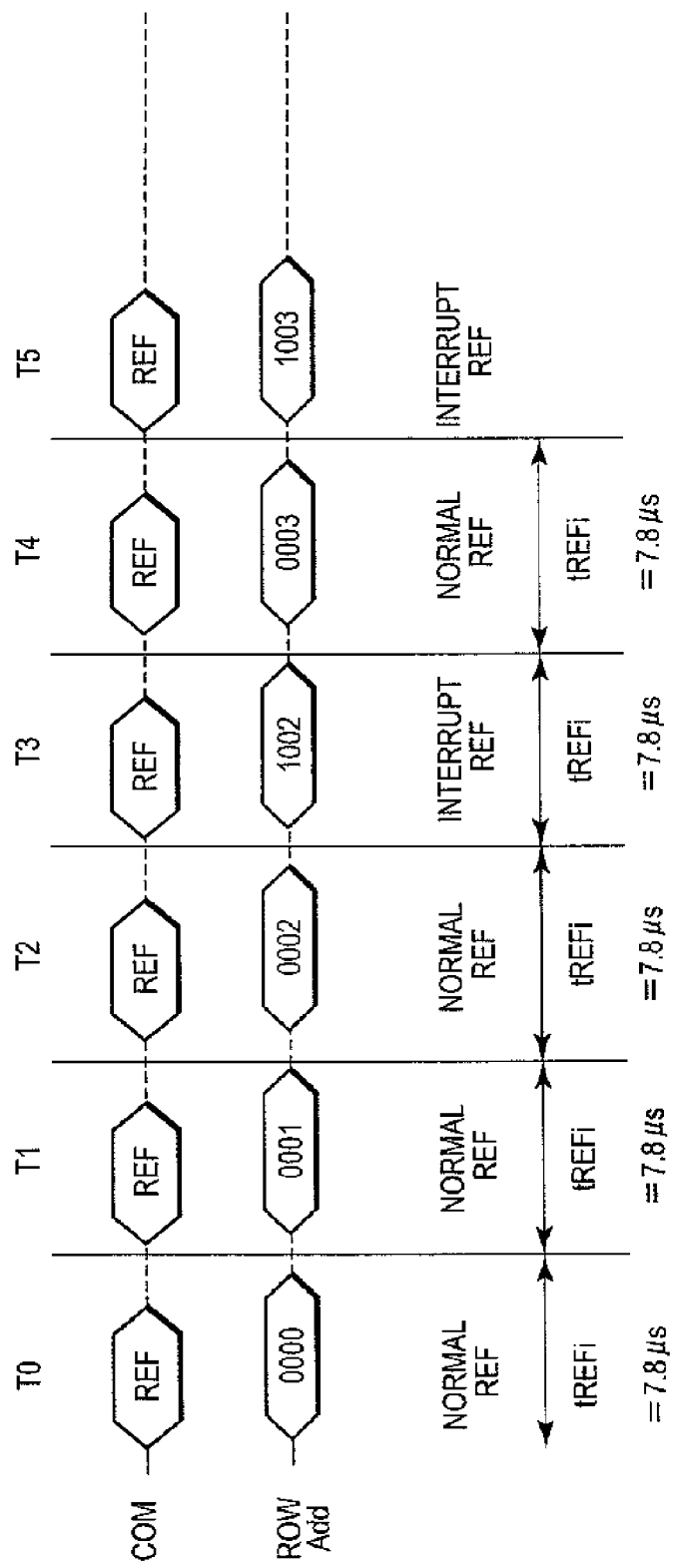
FIG. 11 is a time chart for explaining in detail the method of relieving a defective cell by refresh.

The refresh method shown in (b) of FIG. 10 can be implemented, for example, as shown in FIG. 11. Specifically, the word lines are sequentially activated in response to a refresh command REF input periodically. When a word line of an address having the same lower address as that of an address to be relieved, the word line of the address to be relieved is activated in response to the next refresh command REF.

In FIG. 11, the row addresses are represented by four-digit numbers in order to simplify the illustration. These addresses are different from those addresses of 13 bits described above. The upper two bits of these addresses are represented by binary digits, while the lower two bits are represented by hexadecimal digits. In this example, the addresses to be relieved are "1002" and "1003".

As shown in FIG. 11, the address to be refreshed is sequentially counted up from "0000" to "0001" and to "0002". The lower address of the address "0002" matches the lower address of the address "1002" to be relieved. Thus, the word line of the address "1002" to be relieved is activated in response to the next refresh command after the word line of the address "0002" is activated. During this operation, the word line of the address "0003" which is supposed to be refreshed originally in period T3 is controlled to wait until it is activated in the subsequent period T4. Likewise, the word line corresponding to the address "1003" to be relieved is activated in response to the next refresh command after the period T4 in which the word line of the address "0003" is activated. All of the periods T0 to T5 are the same cycle time (e.g. 7.8 μs).

In the manner as described above, the word lines connected to memory cells having short retention time are refreshed and relieved at a shorter cycle than a normal refresh cycle.

Although FIG. 11 illustrates the case of distributed refresh, the refresh cycle of defective cells can be made shorter than a refresh cycle of normal memory cells also in the case of concentrated refresh.

Detailed description will be made of a configuration and operation of the refresh control circuit 29 for implementing the operation described above.

Figure 12:
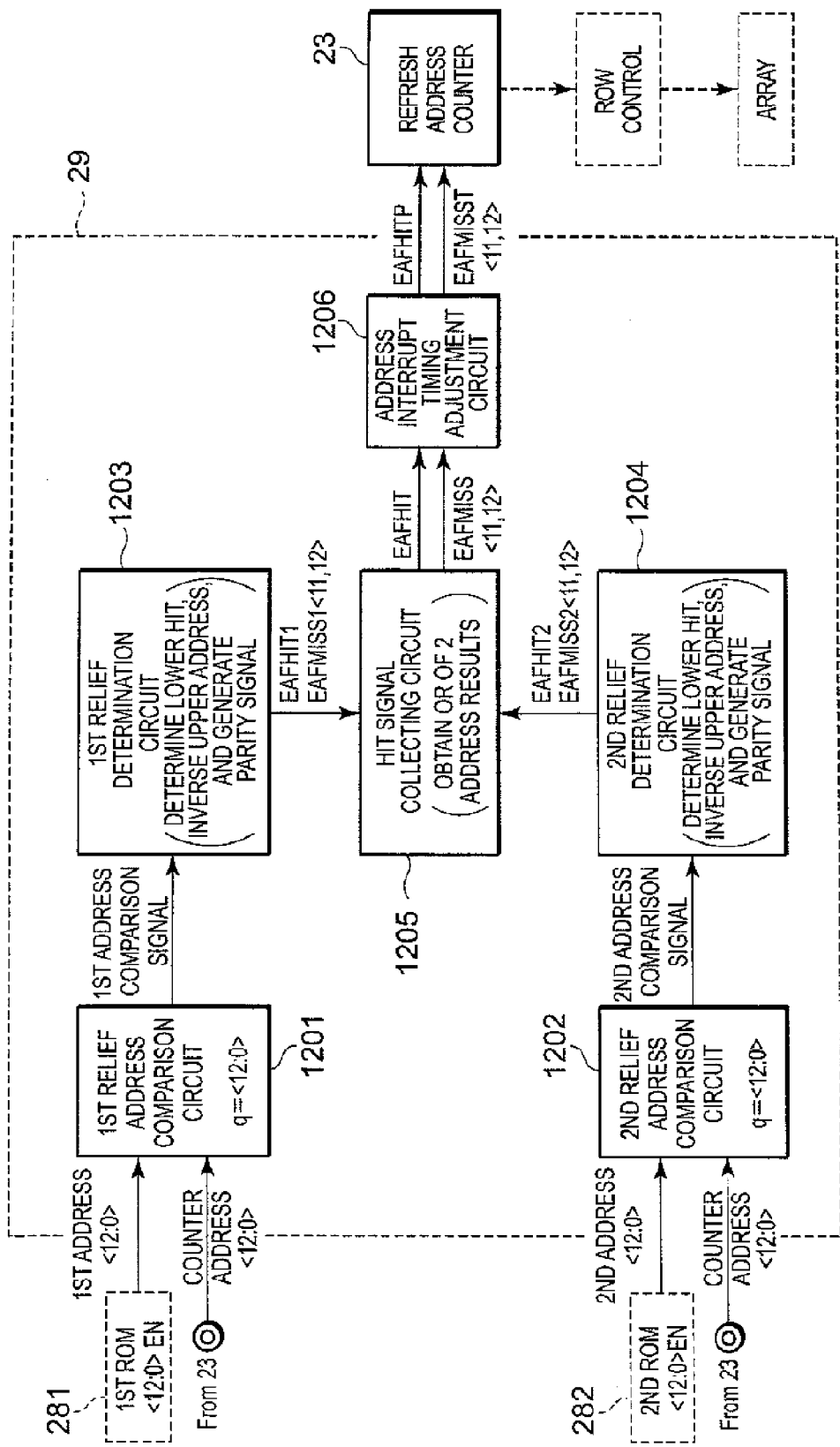
FIG. 12 is a block diagram illustrating an internal configuration of a refresh control circuit provided in the semiconductor device of FIG. 2.

As shown in FIG. 12, the refresh control circuit 29 has a first and a second relief address comparison circuits 1201, 1202, a first and a second relief determination circuits 1203, 1204, a hit signal correcting circuit 1205, and an address interrupt timing adjustment circuit 1206.

The first relief address comparison circuit 1201 compares the first address stored in the first ROM 281 with a counter address held in the refresh address counter 23 bit by bit. Likewise, the second relief address comparison circuit 1202 compares the second address stored in the second ROM 282 with the counter address held in the refresh address counter 23 bit by bit. These first and second relief address comparison circuits 1201, 1202 can be formed by using a known exclusive OR (EOR) circuit. Truth values of the EOR circuit are as shown in FIG. 5.

The first relief determination circuit 1203 generates a first lower address comparison result signal EAFHIT1 and first inverted parity signals EAFMISS1 <11, 12> obtained by inverting the upper addresses (X11, X12) based on the first comparison result indicated by a first address comparison signal from the first relief address comparison circuit 1201. Likewise, the second relief determination circuit 1204 generates a second lower address comparison result signal EAFHIT2 and second inverted parity signals EAFMISS2 <11, 12> obtained by inverting the upper addresses (X11, X12) based on the second comparison result indicated by a second address comparison signal from the second relief address comparison circuit 1202.

Figure 13:
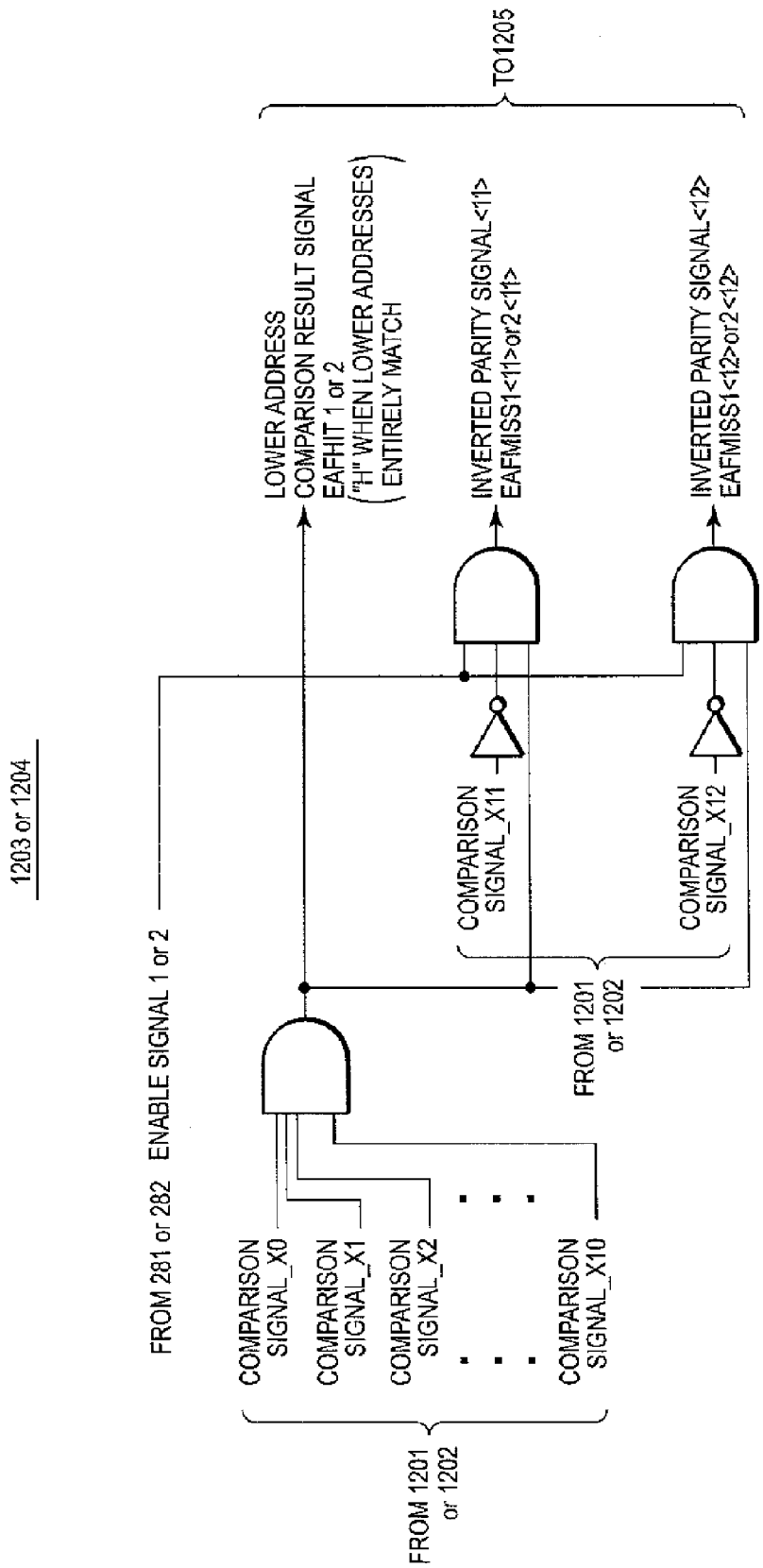
FIG. 13 is a circuit diagram illustrating an internal configuration of a first or second relief determination circuit provided in the refresh control circuit of FIG. 12.

Each of the first and second relief determination circuits 1203, 1204 is configured, for example, as shown in FIG. 13. According to this configuration, the lower address comparison result signal EAFHIT (1 or 2) becomes "H" when all the comparison signals_0 to X10 indicate "match" (all the comparison signals_0 to X10 are "H"). When the ENABLE signal (1 or 2) is "H" and the lower address comparison result signal EAFHIT (1 or 2) is also "H", inverted parity signals EAFMISS (1 or 2) <11> and EAFMISS (1 or 2) <12> obtained by inverting the upper addresses (X11, X12) are output. In FIG. 12, these inverted parity signals are combined together and notated as EAFMISS (1 or 2) <11, 12>. The other signals are also notated in the same manner.

In the state in which no address to be relieved is written in the first or second ROM, the ENABLE signal inhibits relief of the address in which the lower address bits are all "0".

Returning to FIG. 12, the hit signal correcting circuit 1205 receives first and second lower address comparison result signals EAFHIT1, EAFHIT2 from the first and second relief determination circuits 1203, 1204. The hit signal correcting circuit 1205 outputs an integrated lower address comparison result signal EAFHIT based on these first and second lower address comparison result signals EAFHIT1, EAFHIT2. The hit signal correcting circuit 1205 additionally outputs integrated parity signals EAFMISS <11, 12> based on the first and second lower address comparison result signals EAFHIT1, EAFHIT2 and first and second inverted parity signals EAFMISS1 <11, 12>, EAFMISS2 <11, 12>.

Figure 14:
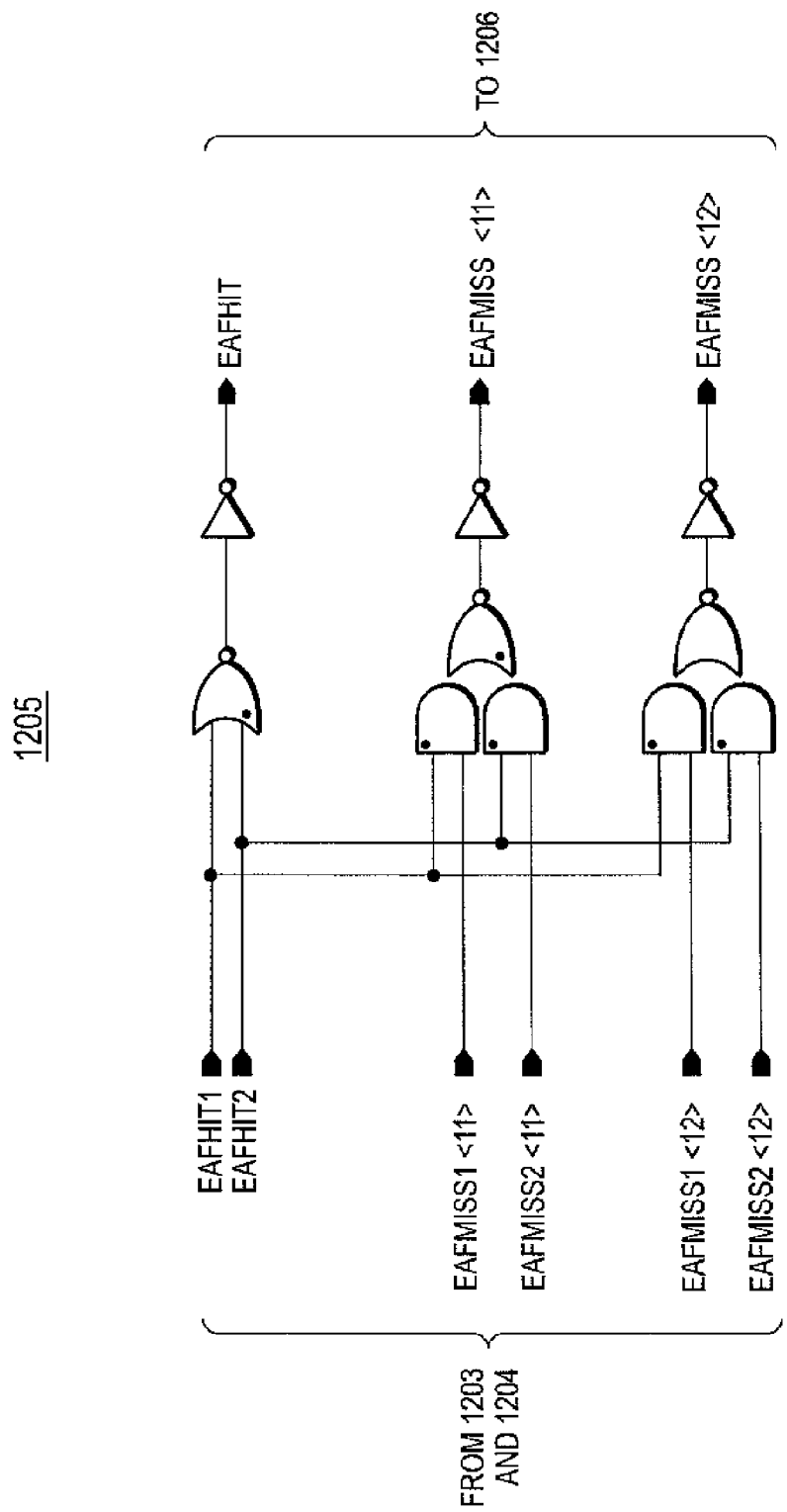
FIG. 14 is a circuit diagram illustrating an internal configuration of a hit signal correcting circuit provided in the refresh control circuit of FIG. 12.

The hit signal correcting circuit 1205 is configured, for example, as shown in FIG. 14. The hit signal correcting circuit 1205 obtains a logical sum (OR) of the first and second lower address comparison result signals EAFHIT1, EAFHIT2, and outputs it as an integrated lower address comparison result signal EAFHIT. When one of the first and second lower address comparison result signals EAFHIT1, EAFHIT2 is "H", the integrated lower address comparison result signal EAFHIT becomes "H. According to this embodiment, both the first and second lower address comparison result signals EAFHIT1, EAFHIT2 will not become "H" simultaneously.

Further, the hit signal correcting circuit 1205 obtains a logical product (AND) of the first lower address comparison result signal EAFHIT1 and each of the first inverted parity signals EAFMISS1 <11, 12>. At the same time, the hit signal correcting circuit 1205 obtains a logical product (AND) of the second lower address comparison result signal EAFHIT2 and each of the second inverted parity signals EAFMISS2 <11, 12>. The hit signal correcting circuit 1205 then obtains a logical sum of the two logical products corresponding to each bit. The logical sums thus obtained are output as integrated inverted parity signals EAFMISS <11> and EAFMISS<12> to the address interrupt timing adjustment circuit 1206.

Referring again to FIG. 12, the address interrupt timing adjustment circuit 1206 generates an interrupt actuating signal EAFHITP and final parity signals EAFMISST <11, 12> based on the integrated lower address comparison result signal EAFHIT and the integrated inverted parity signals EAFMISS <11, 12> from the hit signal correcting circuit 1205, and outputs the generated signals to the refresh address counter 23.

Figure 15:
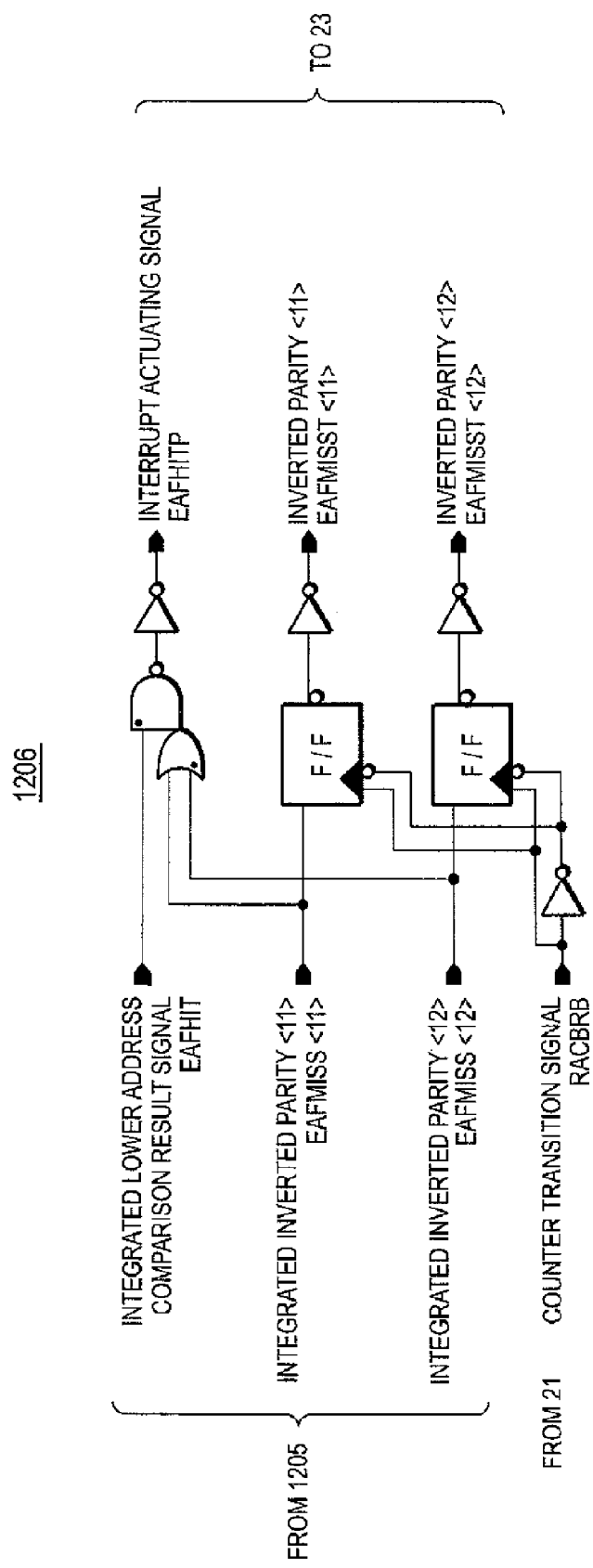
FIG. 15 is a circuit diagram illustrating an internal configuration of an address interrupt timing adjustment circuit provided in the refresh control circuit of FIG. 12.

The address interrupt timing adjustment circuit 1206 is configured, for example, as shown in FIG. 15. When one of the integrated inverted parity signals EAFMISS <11> and EAFMISS <12> is "H" and the integrated lower address comparison result signal EAFHIT is "H", the interrupt actuating signal EAFHITP becomes "H". In addition, the integrated inverted parity signals EAFMISS <11> and EAFMISS <12> are output respectively as final parity signals EAFMISST<11> and EAFMISST<12> in response to rise of a counter transition signal RACBRB. The interrupt actuating signal EAFHITP is used to temporarily inhibit the counting operation of the refresh address counter 23.

Returning to FIG. 12, the refresh address counter 23 receives the interrupt actuating signal EAFHITP and integrated inverted parity signals EAFMISS <11, 12>. The refresh address counter 23 normally performs a count-up operation in response to the counter transition signal RACBRB from the controller 21 (see FIG. 2). Upon receiving the interrupt actuating signal EAFHITP and integrated inverted parity signals EAFMISS <11, 12> from the address interrupt timing adjustment circuit 1206, the refresh address counter 23 stops the count-up operation according to these signals, and generates an address to be relieved.

Figure 16:
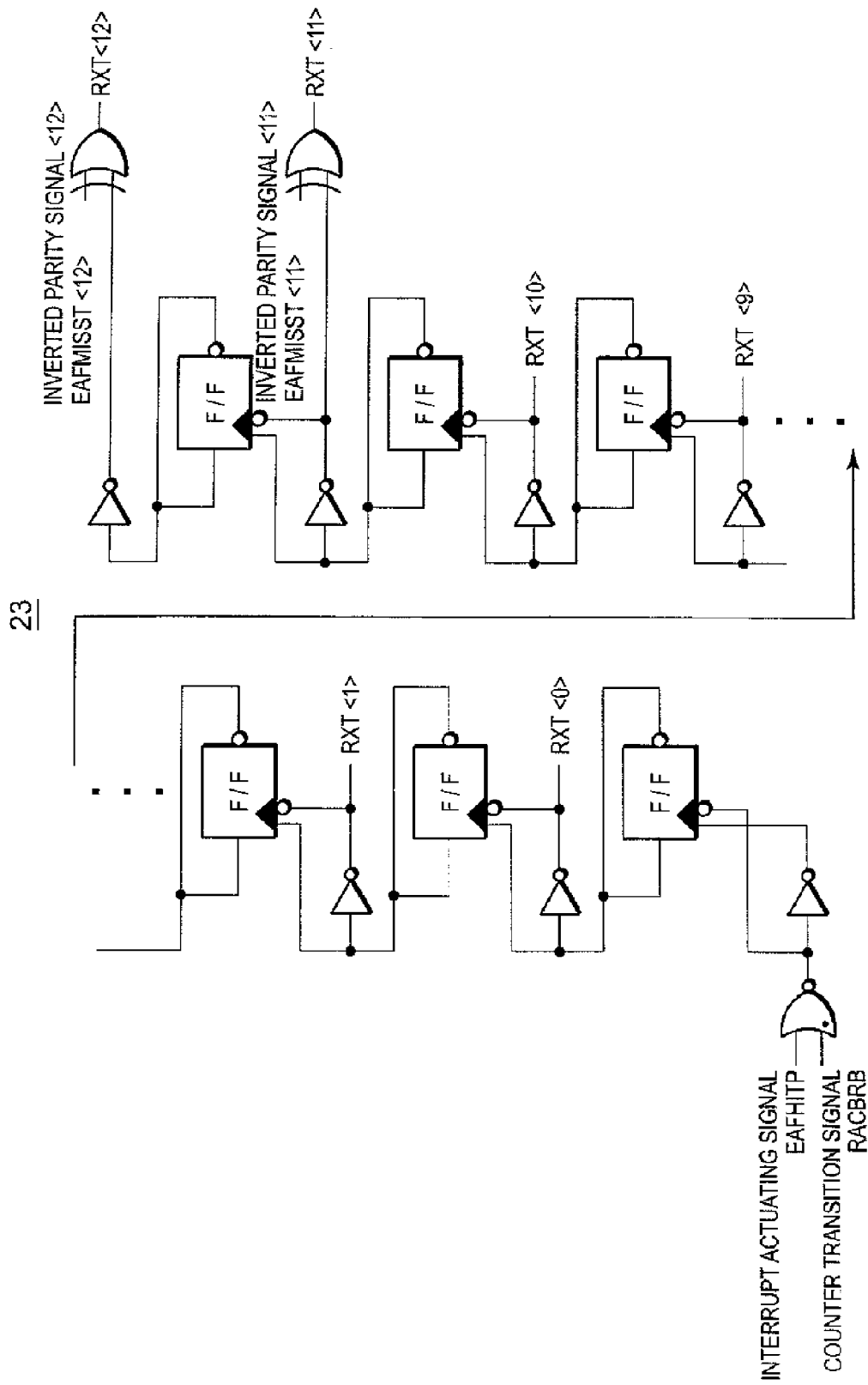
FIG. 16 is a circuit diagram illustrating an internal configuration of a refresh address counter provided in the semiconductor device of FIG. 2.

The refresh address counter 23 is configured, for example, as shown in FIG. 16. When the interrupt actuating signal EAFHITP is "L", the refresh address counter 23 performs a count-up operation in response to the counter transition signal RACBRB and generates a row address RXT <12:0>. When the interrupt actuating signal EAFHITP is "H", the counter transition signal RACBRB is invalidated, and the refresh address counter 23 stops the count-up operation. The row addresses RXT<11> and RXT<12> are logically inverted when the final parity signals EAFMISST<11> and EAFMISST<12> are "H". The row address RXT <12:0> from the refresh address counter 23 is once held inside as a counter address, and output to the address selector 24 in response to fall of an address release signal RRFADSTB. FIG. 16 is a circuit diagram schematically showing only a part of the refresh address counter 23 relating to this invention. In FIG. 16, the output part of the refresh address counter 23 to which the address release signal RRFADSTB is supplied is omitted since it is easily understandable by those skilled in the art. The address release signal RRFADSTB and a counter transition signal RACBRB to be described later and shown in FIG. 17 are generated by the controller 21.

Next, description will be made of operation of the refresh control circuit 29 and the refresh address counter 23. The refresh control circuit 29 and the refresh address counter 23 operate, for example, as shown in the time chart on the right side of FIG. 17. For comparison, a time chart of a semiconductor device in which no relief operation is performed is shown on the left side of FIG. 17.

Figure 17:
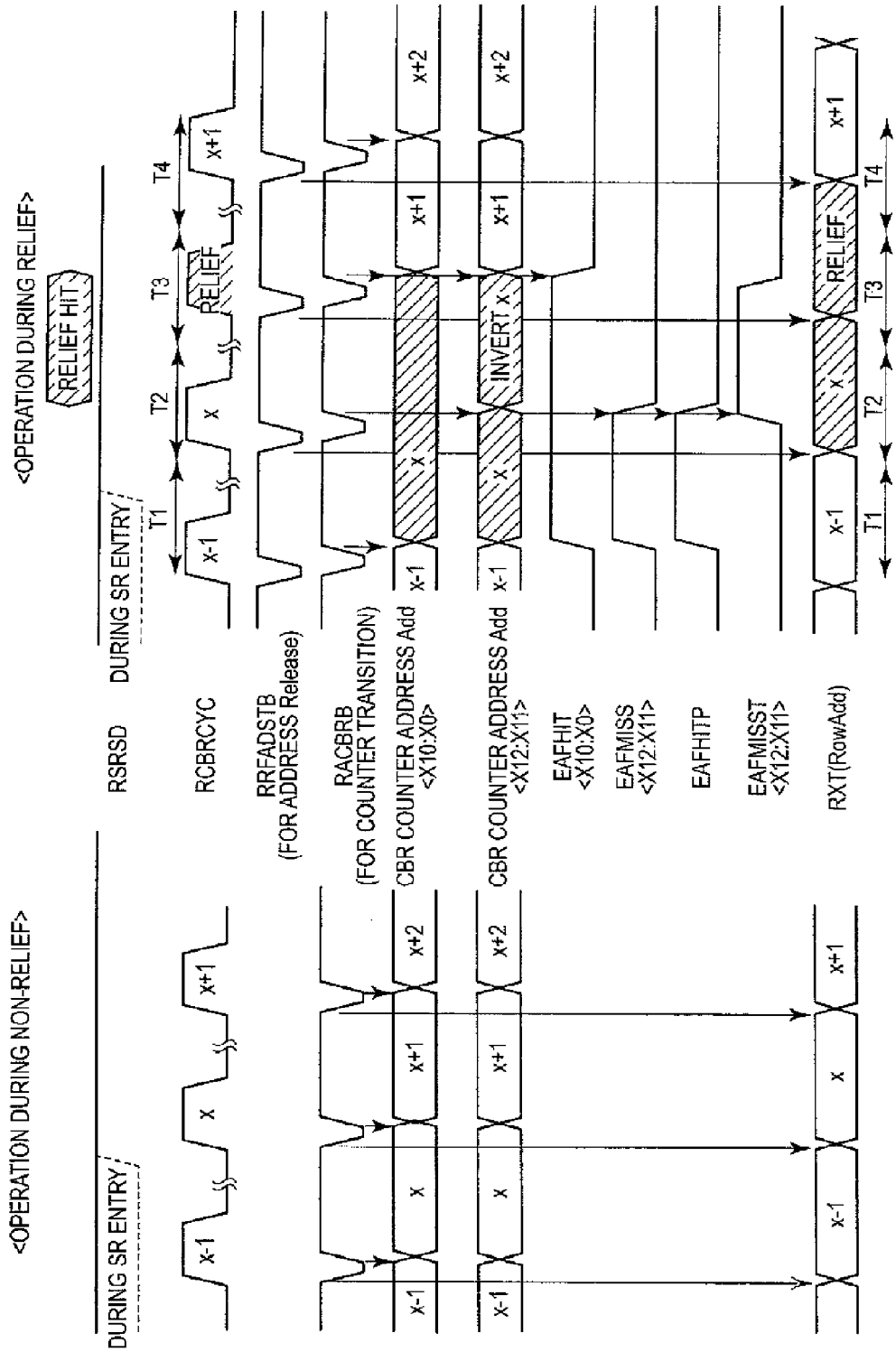
FIG. 17 is a time chart for explaining operation of the refresh control circuit of FIG. 12.
Figure 18:
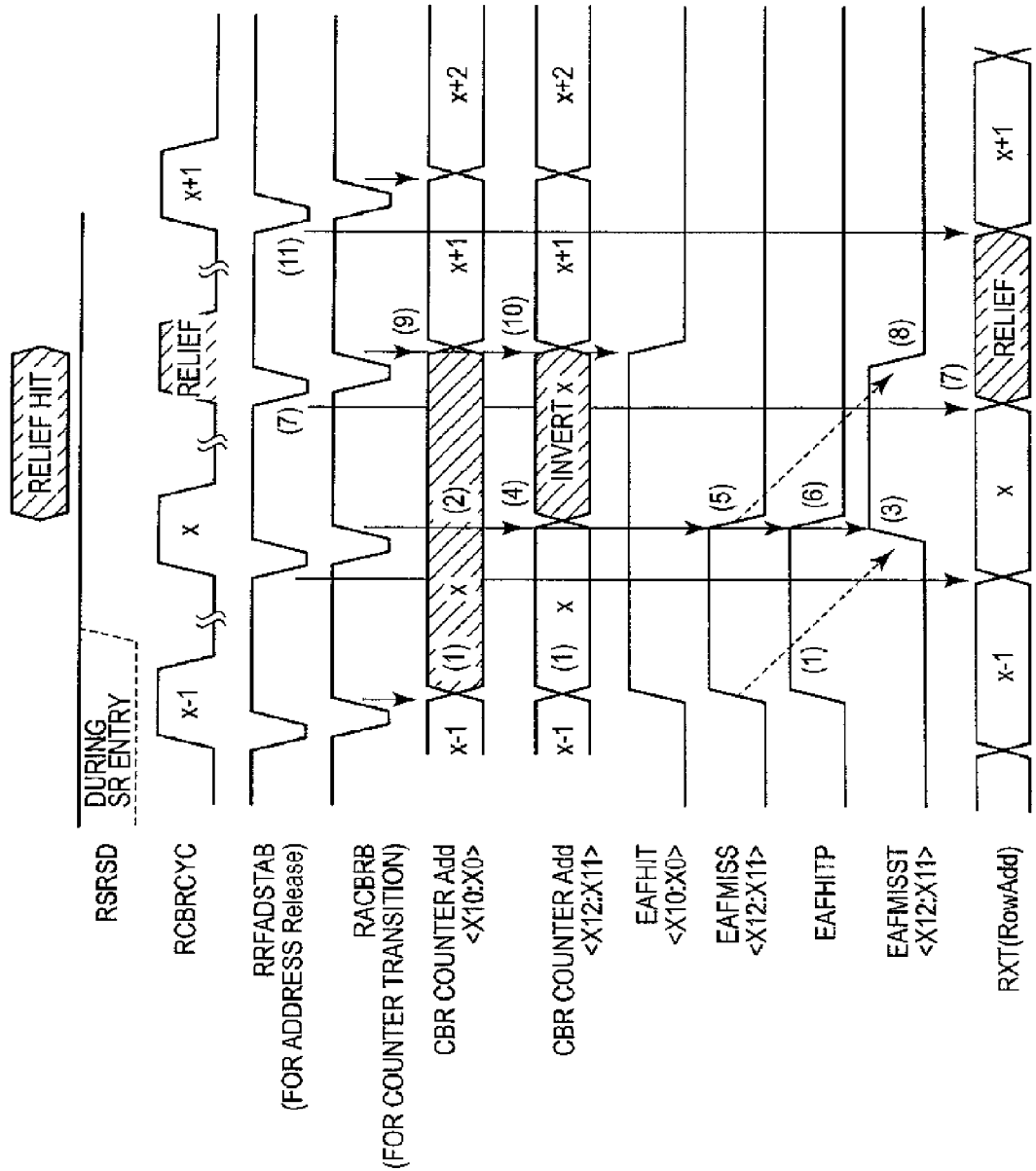
FIG. 18 is an enlarged view of the right half of FIG. 17.

FIG. 18 is an enlarged view of the time chart on the right side of FIG. 17. Referring to FIG. 18, description will be made of operation of the refresh control circuit 29 and the refresh address counter 23 according to the sequence of operation steps (according to the numerals in parentheses in FIG. 18).

The refresh address counter 23 normally performs a count-up operation in response to rise of the counter transition signal RACBRB, and releases the counted value (set address) in response to fall of the address release signal RRFADSTAB.

(1): It is assumed that the refresh address counter 23 performs a count-up operation and an address x is set. It is assumed that this address x does not match the address to be relieved which is recorded in the first ROM 281 or the second ROM 282 in the upper address <X12:X11> but matches in the lower address <X10:X0>. In this case, the integrated lower address comparison result signal EAFHIT from the hit signal correcting circuit 1205 becomes "H". As a result, the interrupt actuating signal EAFHITP from the address interrupt timing adjustment circuit 1206 also becomes "H".

(2): Once the interrupt actuating signal EAFHITP becomes "H", the refresh address counter 23 stops the count-up operation. However, the counter transition signal RACBRB is toggled.

(3): The counter transition signal RACBRB is also supplied to the address interrupt timing adjustment circuit 1206. The address interrupt timing adjustment circuit 1206 makes the signals EAFMISST <11, 12> "H" at the subsequent rise of the counter transition signal RACBRB. This means that either one or both of the signals EAFMISST<11> and EAFMISST<12> are made "H".

(4): Once the signals EAFMISST <11, 12> become "H", the refresh address counter 23 logically inverts either one or both of the row addresses RXT<11> and RXT<12>. Specifically, if the EAFMISST <11> is "H", the row address RXT <11> is inverted, whereas if the EAFMISST <12> is "H", the row address RXT <12> is inverted. Thus, a relief address <X12:X0> is set as a counter address in the refresh address counter 23.

(5): When the relief address <X12:X0> is set as the counter address in the refresh address counter 23, the integrated parity signals EAFMISS <11, 12> from the hit signal correcting circuit 1205 thereby become "L".

(6): When the integrated parity signals EAFMISS <11, 12> become "L", the interrupt actuating signal EAFHITP also thereby becomes "L".

(7): The relief address set in the refresh address counter 23 is released in response to the next internal address release signal. Specifically, a signal indicating the counted value of the refresh address counter 23 is output to the address selector 24 as a row address signal RXT.

(8): In response to the next rise of the counter transition signal RACBRB, the address interrupt timing adjustment circuit 1206 turns the final parity signals EAFMISST <11, 12> to "L".

(9): Since the interrupt actuating signal EAFHITP is "L", the refresh address counter 23 counts up in response to rise of the counter transition signal RACBRB so that the normal next address x+1 is set.

(10): Since the final parity signals EAFMISST <11, 12> are "L", the upper address of the normal next address x+1 is set also for the upper addresses X12 and X11.

(11): The address x+1 set in the refresh address counter 23 is released in response to the next fall of the address release signal.

By the configuration as described above, the semiconductor device according to this embodiment of the invention is enabled to shorten the refresh cycle for defective cells in comparison with a normal refresh cycle. Since, in the embodiment above, the upper address is supposed to consist of two bits, the refresh cycle for an address to be relieved can be shortened to one fourth of the normal refresh cycle. Any defective cell can be relieved in this manner. It will be easily understood that, since the counter transition signal RACBRB and the address release signal RRFADSTB both generated by the controller 21 are synchronized in a predetermined period (T1, T2, T3, and T4), they are synchronized with a refresh execution signal issued by the controller 21. The refresh execution signal is generated by a command COM input from the command input terminal 41, or generated by the self-refresh timer 22. In FIG. 17, the solid line for the signal RSRSD represents a refresh period generated by the command COM while the dashed line for the signal RSRSD represents a refresh period indicated by the self-refresh timer 22. The signal RCBRCYC is a refresh execution signal which is issued by the controller 21 and output once per predetermined period (T1, T2, T3, T4). The signal RCBRCYC has a pulse width defined by an arbitrary time period.

Although this invention has been described with respect to its preferred exemplary embodiments, the invention is not limited to these embodiments but various modifications and alterations are possible within the scope of the invention. Furthermore, the circuit configurations in the circuit blocks illustrated in the drawings, and other circuits for generating control signals are not limited to those illustrated in the drawings.

For example, the technical concept of this invention is applicable to setting of information in a plurality of ROMs used for various functions. It can be also used to write relief addresses in ROMs used for physical relief.

Further, the technical concept of the semiconductor device and its control method of this invention is applicable to various semiconductor devices. For example, this invention is applicable to semiconductor devices in general including a CPU (Central Processing Unit), an MCU (Micro Control Unit), a DSP (Digital Signal Processor), an ASIC (Application Specific Integrated Circuit), an ASSP (Application Specific Standard Circuit), and a memory. Products to which such a semiconductor device of this invention is applied include, for example, a SOC (System On Chip), a MCP (MultiChip Package), and a POP (Package On Package). This invention is applicable to these semiconductor devices having an arbitrary product form or package form.

Transistors used in the circuits may be any of field effect transistors (FETs), and various types of FETs can be used, such as MOS (Metal Oxide Semiconductor), MIS (Metal-Insulator Semiconductor), and TFT (Thin Film Transistor). Further, a bipolar transistor may be included in some part of the device.

Further, various disclosed elements of this invention can be combined or selected in a variety of manners within the scope of the invention defined in the following claims. It should be understood that various changes and modifications, which will be apparent to those skilled in the art based on all the disclosures including the claims and the technical concept, are covered by this invention.

What is claimed is:

1. A device comprising:
a set of input nodes supplied with a plurality of defective addresses, each of the defective addresses comprising a more significant bit portion, that contains at least one bit including a most significant bit, and a less significant bit portion, that contains two or more bits including a least significant bit;
first and second latch circuits each electrically connected to the set of input nodes;
a control circuit configured to control the first and second latch circuits such that the first latch circuit latches a first one of the defective addresses to produce a first latched defective address and that the second latch circuit does not latch a second one of the defective addresses, that is equal in less significant bit portion to the first latched defective address, and latches a third one of the defective addresses, that is different in less significant bit portion from the first latched defective address, to produce a second latched defective address;
a first non-volatile memory coupled to the first latch circuit and configured to be written with the first latched defective address; and
a second non-volatile memory coupled to the second latch circuit and configured to be written with the second latched defective address.

2. The device as claimed in claim 1, further comprising:
a memory cell array including a plurality of word lines and a plurality sets of volatile memory cells, each of the sets of volatile memory cells being coupled to a corresponding one of the word lines;
a refresh address counter producing a plurality of refresh addresses in sequence, each of the refresh addresses designating a corresponding one of the word lines to bring an associated one of the sets of volatile memory cells into a refresh operation, each of the refresh addresses comprising a more significant bit portion, that contains at least one bit including a most significant bit, and a less significant bit portion, that contains two or more bits including a least significant bit; and
a refresh control circuit configured to perform a refresh operation on one of the sets of volatile memory cells coupled to a corresponding one of the word lines that is designated by an associated one of the refresh addresses and further on another of the sets of volatile memory cells coupled to another of the word lines that is designated by one of the first and second latched defective addresses which is different in more significant bit portion from and is equal in less significant bit portion to the associated one of the refresh addresses.

3. The device as claimed in claim 2, wherein each of the first and second non-volatile memories comprises a plurality of fuses, and each of the volatile memory cells comprises a dynamic memory cell.

4. A device comprising:
a set of input nodes supplied with a plurality of defective addresses, each of the defective addresses comprising a more significant bit portion, that contains at least one bit including a most significant bit, and a less significant bit portion, that contains two or more bits including a least significant bit, the defective addresses including first, second and third defective addresses, the first defective address being different in the more significant bit portion from and equal in the less significant bit portion to the second defective address, and the third address being different at least in the less significant bit portion from the first defective address;
a set of latch circuits electrically connected to the set of input nodes;
a control circuit configured to allow the first defective address to be latched in one of the set of latch circuits, refrain the second defective addresses from being latched in any of the set of latch circuits and allow the third defective address to be latch in another of the set of latch circuits;
a first non-volatile memory coupled to the set of latch circuits and configured to be written with the first defective address; and
a second non-volatile memory coupled to the sets of latch circuits and configured to be written with the second defective address.

5. The device as claimed in claim 4, further comprising:
a memory cell array including a plurality of word lines and a plurality sets of volatile memory cells, each of the sets of volatile memory cells being coupled to a corresponding one of the word lines;
a refresh address counter producing a plurality of refresh addresses in sequence, each of the refresh addresses designating a corresponding one of the word lines to bring an associated one of the sets of volatile memory cells into a refresh operation, each of the refresh addresses comprising a more significant bit portion, that contains at least one bit including a most significant bit, and a less significant bit portion, that contains two or more bits including a least significant bit; and
a refresh control circuit configured to perform a refresh operation on one of the sets of volatile memory cells coupled to a corresponding one of the word lines that is designated by an associated one of the refresh addresses and further on another of the sets of volatile memory cells coupled to another of the word lines that is designated by one of the first defective address in the first non-volatile memory and the third defective address in the second non-volatile memory which is different in more significant bit portion from and is equal in less significant bit portion to the associated one of the refresh addresses.

6. The device as claimed in claim 5, wherein each of the first and second non-volatile memories comprises a plurality of fuses, and each of the volatile memory cells comprises a dynamic memory cell.

7. A method comprising:
receiving a plurality of defective addresses, each of the defective addresses comprising a more significant bit portion, that contains at least one bit including a most significant bit, and a less significant bit portion, that contains two or more bits including a least significant bit, the defective addresses including first, second and third defective addresses, the first defective address being different in the more significant bit portion from and equal in the less significant bit portion to the second defective address, and the third address being different at least in the less significant bit portion from the first defective address;
latching a first one of the defective addresses in a first latch circuit to produce a first latched defective address;
performing one of first and second operations on a second one of the defective addresses, the first operation being performed when the second one of the defective addresses is different in the more significant bit portion from and equal in the less significant bit portion to the first latch defective address and being such that the second one of the defective addresses is not latched in a second latch circuit, and the second operation being performed when the second one of the defective addresses is different at least in the less significant bit portion from the first latch defective address and being such that the second one of the defective addresses is latched in a second latch circuit to produce a second patched defective address;
writing the first latched defective address into a first non-volatile memory; and
writing the second latched defective address into a second non-volatile memory.

8. The method as claimed in claim 7, further comprising:
producing a plurality of refresh addresses to a memory cell array that includes a plurality of word lines and a plurality sets of volatile memory cells, each of the sets of volatile memory cells being coupled to a corresponding one of the word lines, each of the refresh addresses designating a corresponding one of the word lines to bring an associated one of the sets of volatile memory cells into a refresh operation, each of the refresh addresses comprising a more significant bit portion, that contains at least one bit including a most significant bit, and a less significant bit portion, that contains two or more bits including a least significant bit; and
performing a refresh operation on one of the sets of volatile memory cells coupled to a corresponding one of the word lines that is designated by an associated one of the refresh addresses and further on another of the sets of volatile memory cells coupled to another of the word lines that is designated by one of the first and second latched defective addresses which is different in more significant bit portion from and is equal in less significant bit portion to the associated one of the refresh addresses.

9. The method as claimed in claim 8, wherein each of the first and second non-volatile memories comprises a plurality of fuses, and each of the volatile memory cells comprises a dynamic memory cell.

* * * * *